(12) United States Patent
Gardner et al.

(10) Patent No.: US 6,346,427 B1
(45) Date of Patent: *Feb. 12, 2002

(54) PARAMETER ADJUSTMENT IN A MOS INTEGRATED CIRCUIT

(75) Inventors: Harry N. Gardner; Debra S. Harris; Michael D. Lahey; Stacia L. Patton; Peter M. Pohlenz, all of Colorado Springs, CO (US)

(73) Assignee: UTMC Microelectronic Systems Inc., Colorado Springs, CO (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/376,246

(22) Filed: Aug. 18, 1999

(51) Int. Cl.$^7$ .................................................. H01L 21/00
(52) U.S. Cl. ........................................................ 438/10
(58) Field of Search ................................. 438/10, 5–13, 438/14–18, 800; 352/40; 364/512

(56) References Cited

U.S. PATENT DOCUMENTS

| | | |
|---|---|---|
| 4,124,899 A | 11/1978 | Birkner et al. |
| 4,197,555 A | 4/1980 | Uehara et al. |
| 4,238,839 A | 12/1980 | Redfern et al. |
| 4,240,094 A | 12/1980 | Mader |
| 4,455,495 A | 6/1984 | Masuhara et al. |
| 4,924,287 A | 5/1990 | Orbach |
| 4,974,048 A * | 11/1990 | Chakravorty et al. ......... 357/40 |
| 5,047,664 A | 9/1991 | Moyal |
| 5,157,618 A | 10/1992 | Ravindra et al. |
| 5,160,995 A | 11/1992 | Wada et al. |
| 5,329,152 A | 7/1994 | Janai et al. |
| 5,350,704 A | 9/1994 | Anderson et al. |
| 5,450,030 A | 9/1995 | Shin et al. |
| 5,452,215 A | 9/1995 | Washabaugh |
| 5,510,730 A | 4/1996 | El Gamal et al. |
| 5,528,600 A | 6/1996 | El Ayat et al. |
| 5,539,224 A | 7/1996 | Ema |
| 5,545,904 A | 8/1996 | Orbach |
| 5,550,496 A | 8/1996 | Desroches |
| 5,552,996 A | 9/1996 | Hoffman et al. |
| 5,563,801 A | 10/1996 | Lee et al. |
| 5,565,758 A | 10/1996 | Yoeli et al. |
| 5,576,554 A | 11/1996 | Hsu |
| 5,623,160 A | 4/1997 | Liberkowski |
| 5,655,109 A | 8/1997 | Hamid |
| 5,659,716 A | 8/1997 | Selvidge et al. |
| 5,665,989 A | 9/1997 | Dangelo |
| 5,679,967 A | 10/1997 | Janai et al. |
| 5,684,713 A * | 11/1997 | Asada et al. ................ 364/512 |
| 5,760,611 A | 6/1998 | Gould |
| 5,767,732 A | 6/1998 | Lee et al. |
| 5,781,031 A | 7/1998 | Bertin et al. |

(List continued on next page.)

Primary Examiner—Charles Bowers
Assistant Examiner—Craig Thompson
(74) Attorney, Agent, or Firm—Morgan & Finnegan, LLP

(57) ABSTRACT

A method of manufacturing an integrated circuit including adjusting a parameter of the operation of the integrated circuit, such as power dissipation, after prototype testing by changing only one mask. If prototype testing indicates that the performance specification for power dissipation, for example, is not met, the power dissipation can be adjusted by changing the size of the active areas to change the channel width of the gates of the circuit, by changing the size of the patterns of the active area masks. To decrease power dissipation, the size of the active area is decreased. Only the active mask need be changed. Preferably, the active area around the original contacts are maintained so that the positions of the contacts need not be changed. Consequently, the mask for defining the position of the contacts and the masks for defining the metallization layers need not be changed. To increase power dissipation, the size of the active areas is increased. The values of other parameters may be changed, as well.

27 Claims, 8 Drawing Sheets

U.S. PATENT DOCUMENTS

| | | |
|---|---|---|
| 5,801,406 A | 9/1998 | Lubow et al. |
| 5,831,280 A | 11/1998 | Ray |
| 5,835,396 A | 11/1998 | Zhang |
| 5,841,967 A | 11/1998 | Sample et al. |
| 5,874,834 A | 2/1999 | New |
| 5,885,749 A | 3/1999 | Huggins et al. |
| 5,903,490 A | 5/1999 | Rotem et al. |
| 5,913,101 A | 6/1999 | Murofushi et al. |
| 5,926,035 A | 7/1999 | Raza |
| 5,946,211 A | 8/1999 | Glover |
| 5,959,466 A | 9/1999 | McGowan |
| 6,012,079 A | 1/2000 | Song |
| 6,038,174 A | 3/2000 | Khan et al. |

\* cited by examiner

PARAMETER ADJUSTMENT IN A MOS INTEGRATED CIRCUIT

FIELD OF THE INVENTION

A method for adjusting parameters of an integrated circuit, and, more particularly, a method for adjusting power dissipation in a metal oxide semiconductor integrated circuit after a prototype design has been completed.

BACKGROUND OF THE INVENTION

Modern electronic circuits and systems are built on the foundation of discrete semiconductor devices and integrated circuits. An integrated circuit consists of both active and passive elements formed on a silicon substrate. Metal layers are provided to interconnect the electrically isolated active and passive elements, defining particular logic and circuit functions.

A Metal Oxide Semiconductor ("MOS") integrated circuit is one of the most popular type of integrated circuits in digital applications, where only an on-off transistor response is required. A particularly useful unit cell for the integrated circuit is a Complementary MOS ("CMOS"), which uses both n-channel and p-channel MOS field effect transistors ("FET") on adjacent regions of the chip. CMOS is one of the most widely used unit cells for various integrated circuits. One of the advantages of using CMOS is that the standard dc power dissipation can be reduced to very small levels.

A gate array is an integrated circuit including an array of unit cells such as CMOS arranged regularly on a semiconductor substrate, wherein interconnections for connecting the unit cells have not yet been formed. Desired logic functions, such as NAND, NOR or AND logic circuits may be obtained by connecting unit cells of the gate arrays into a functional block. Metal and insulating layers are added over the gate array to provide the interconnections required to define the functional block, in accordance with customer's orders.

While gate array architectures are standardized at the chip geometry level, it is advantageous to provide standardization at the logic or function level, as well. A design may be created for any logic function which may be needed, including logic circuits, flip-flops and arithmetic logic unit functions. The design is commonly termed a "cell". A plurality of different cells may be stored in a cell library for use in the design of a chip.

Fabrication of a CMOS gate array based integrated circuit may be divided into two phases: unit transistor formation phase and personalization/customization phase. Unit transistors are fabricated according to an n-well or p-well CMOS process which includes the steps of forming a well, defining an active area, growing field oxide for isolating unit cells, growing a thin oxide over the active area to define a gate insulator, depositing a polysilicon layer over the gate insulator to form a gate electrode and doping the active area to form source and drain regions. An oxide layer covers the top of the unit cell and contact points for enabling connection of the diffusion regions with the metallization layers to be provided in the personalization phase, are formed by the selective etching of the points.

In the personalization phase, the unit cells are interconnected to form logic circuits and the logic circuits are interconnected to implement the functions required by the customer. Typically, a first metal layer is deposited over the oxide layer of the unit transistors, an insulating oxide layer is deposited over the first metal layer and a second metal layer is deposited over the insulating oxide layer.

Throughout the first and second phase of the fabrication process, each of the layers are deposited and patterned in a photolithographic process using a set of customized masks. Commonly, thirteen or more unique masks are needed to fabricate a typical MOS integrated circuit. The design and number of the masks have a significant impact on the time and cost of the fabrication process.

Before commencing full production, it is a common practice to fabricate a small number of prototype integrated chips for testing to verify whether the performance of the integrated circuits fabricated by a set of masks in a production process meets the customer's performance specifications. Testing may be performed at the supplier's or the customer's lab in a real or simulated environment. Such testing may include wafer probing, device parametrics, logical testing and speed/performance testing. If testing indicates that certain parameters of the transistors, such as the power dissipation, need to be modified, the unit cells and the connections between them need to be redesigned by changing the dimensions of the transistors. However, as described above, transistors are complex, multilevel structures which are fabricated by application of a plurality of precisely aligned layers, some of which are interconnected, and a separate mask is required for each layer. A change in the dimensions of the transistors, therefore, requires redesign of most or all of the masks. This is a time consuming process adding additional cost to the fabrication process. Adjustment of the operating parameters of the transistors without redesigning most or all of the verified masks would be advantageous.

SUMMARY OF THE INVENTION

In accordance with one embodiment of the present invention, only one mask of the set of masks used in the fabrication process needs to be redesigned to change the power dissipation of the integrated circuit. That new mask replaces the original active area mask in the set of masks. In the new mask, the patterns for defining the active areas have a different size as compared to the patterns on the original active area mask, changing the channel width of the transistors. Since both the capacitive loading and the current flow in the channel of transistors contribute to the power dissipation of designed circuits, reducing the gate widths of the transistors by reducing the active areas reduces capacitive loading and the current flow, decreasing power dissipation. The active area around the original contacts should be maintained so that the positions of the contacts need not be changed. Consequently, the masks for defining the position of the contacts and the masks for defining the metallization layers need not be changed. Preferably, the contacts are positioned midway between the gates, to facilitate the reduction in the size of the active area. The power dissipation may be increased by increasing the size of the active areas.

DETAILED DESCRIPTION OF THE INVENTION

FIGS. 1a–1g are cross-sectional views of an n-well CMOS in various stages of an exemplary, conventional fabrication process. Every stage is not illustrated. Masks which may be used in each step of the process of FIGS. 1a–1g are shown in FIGS. 2a–2g, respectively.

Figure 1A:
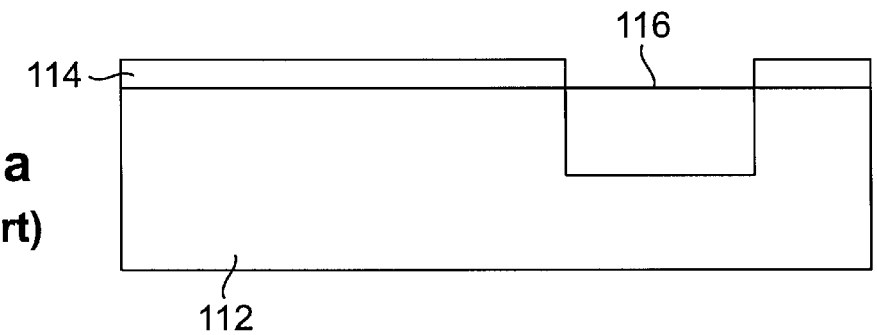
FIGS. 1*a*–1*g* are cross-sectional views of an n-well CMOS in various stages of a conventional fabrication process.
Figure 1B:
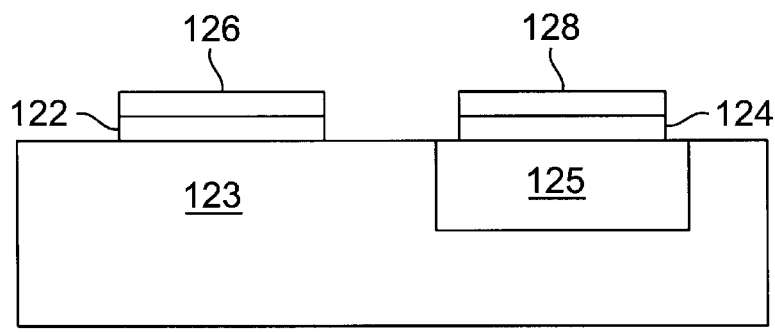

In FIG. 1a, a p-substrate 112 has been covered by a layer of silicon oxide 114 and an n-well 116 has been formed by patterning the silicon oxide 114. The mask 210 of FIG. 2a shows a n-well pattern 212 for defining the n-well (or n-tub) 116 in the p-substrate 112. The n-well 116 may be formed by ion implantation, or deposition and diffusion, as is known in the art FIG. 1b shows regions of silicon oxide 122, 124 and silicon nitride 126, 128 on the substrate 112. These regions cover portions 123, 125 of the substrate which will become active areas in subsequent processing steps, including channel stop implantation and field oxide growing steps. FIG. 2b shows an active mask 220 which can be used to pattern deposited layers of silicon oxide and silicon nitride, to form the regions 122, 124, and 126, 128, respectively. The active area mask 220 may also be used to define the gate insulators 133, 135, discussed with respect to FIG. 1c, below.

Figure 1C:
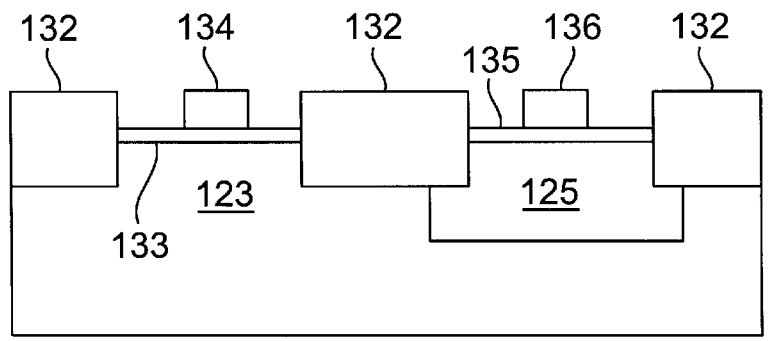
Figure 2A:
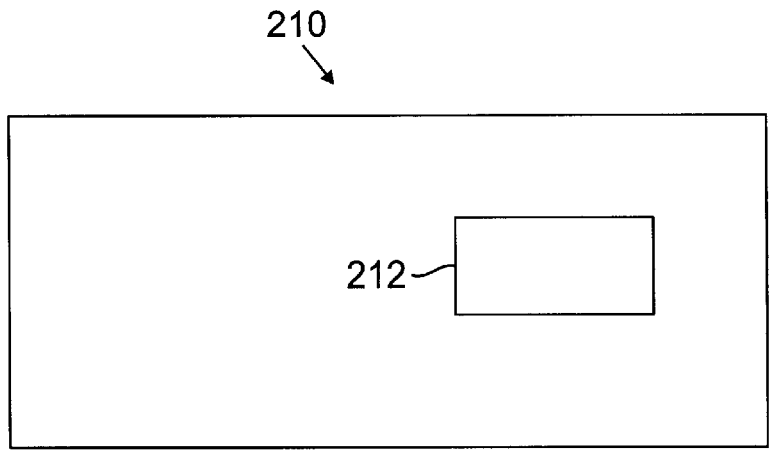
FIG. 2*a*–2*g* are masks which may be used in the fabrication steps shown in FIGS. 1*a*–1*g*, respectively.
Figure 2B:
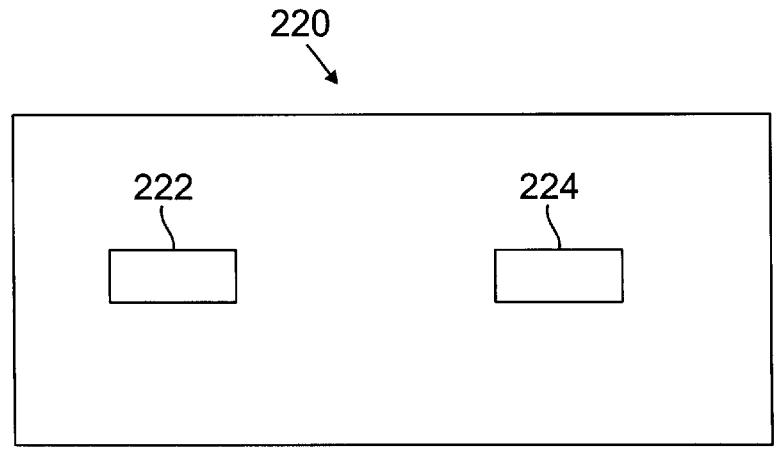
Figure 2C:
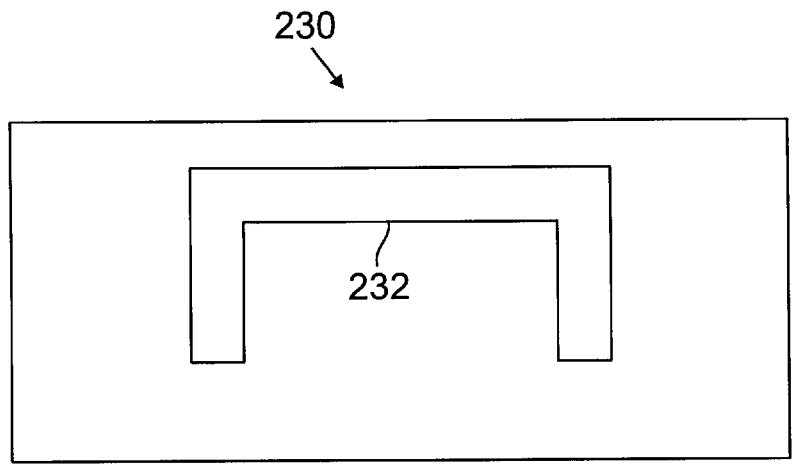

FIG. 1c shows a cross section of two polysilicon gate electrodes 134, 136 formed on top of gate insulators 133, 135 by a corresponding polysilicon mask 230 shown in FIG. 2c. The mask 230 includes a polysilicon gate pattern 232 for forming the polysilicon gate electrodes 134, 136 and their connection. Field oxide 132 has been formed in the portions of the substrate outside of the silicon oxide regions 122, 124 and silicon nitride regions 126, 128. The gate insulators 133, 135 have been formed in the regions of the substrate previously covered by the silicon oxide regions 122, 124 and silicon nitride regions 126, 128 shown in FIG. 1b, prior to formation of the gate electrodes 134, 136. Formation of the field oxide 132 and the gate insulators 133, 135 involve the use of active area mask 220, as well. The polysilicon gate electrodes 134, 136 are used as a self-aligned mask for diffusion for the source and drain regions in later processing steps.

Figure 1D:
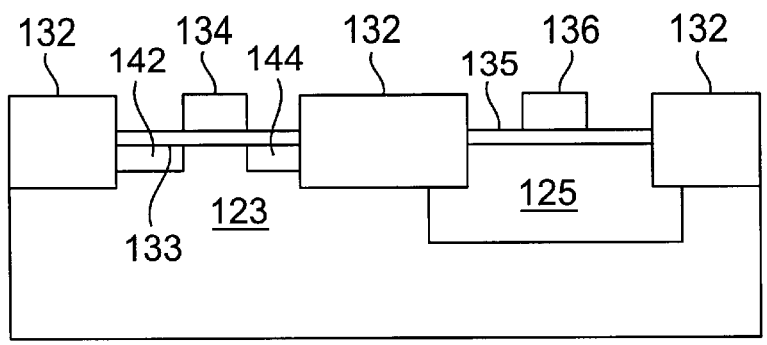
Figure 2D:
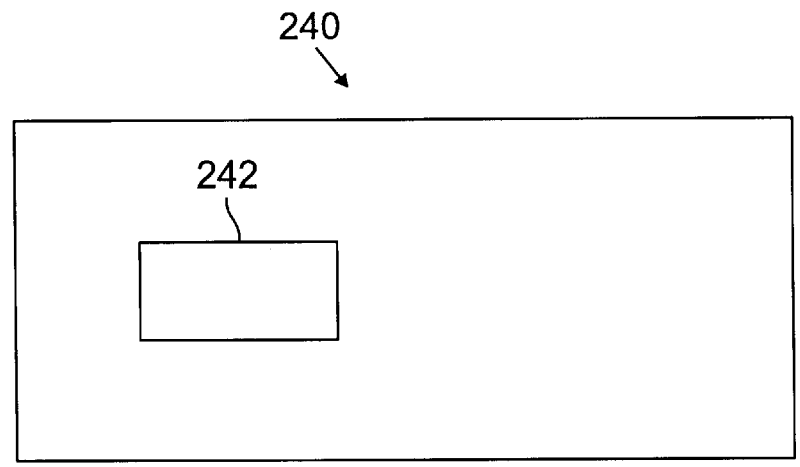

FIG. 1d shows the diffusion region 142, 144 for the n-channel transistor, defined by an n+ mask 240 including a pattern 242, as shown in FIG. 2d. The polysilicon gate electrode 134 acts as a self-aligned mask for the diffusion regions 142, 144, which are formed by ion implantation or deposition and diffusion.

Figure 1E:
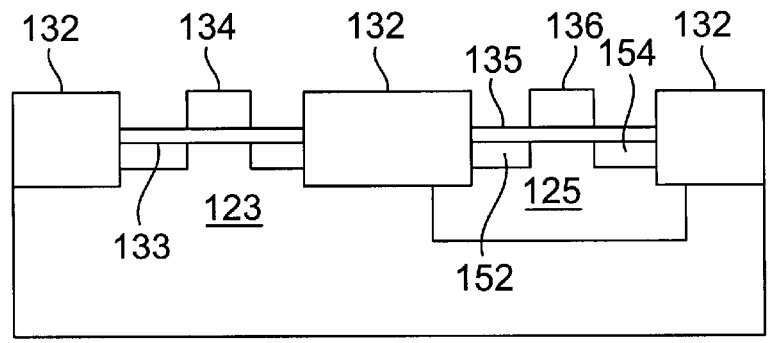
Figure 2E:
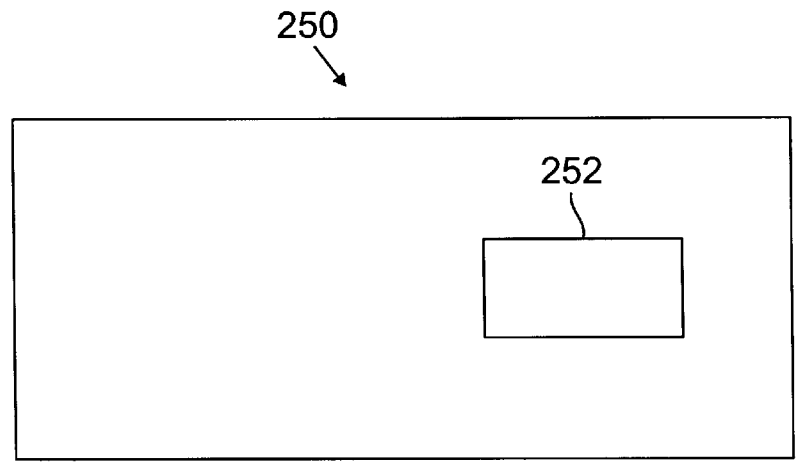

FIG. 1e shows the diffusion region 152, 154 for the p-channel transistor, formed within the n-well 116 of the substrate 112. FIG. 2e shows a mask 250 including a pattern 252, which may be used to form the diffusion regions 152, 154. The polysilicon gate electrode 136 acts as a self-aligned mask for the implantation of the diffusion regions 152, 154, as well.

Figure 1F:
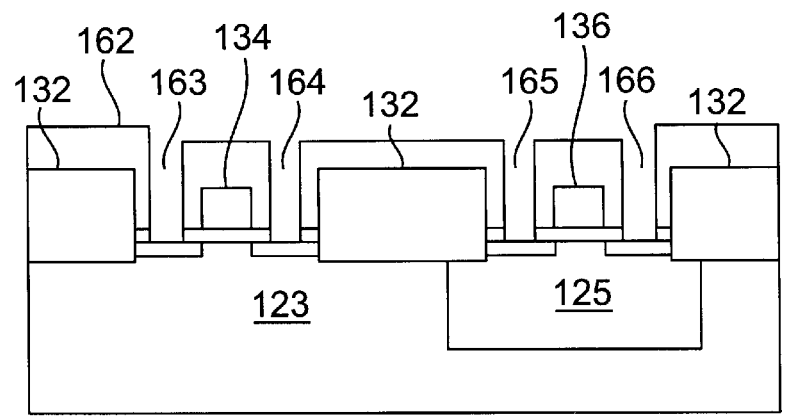
Figure 2F:
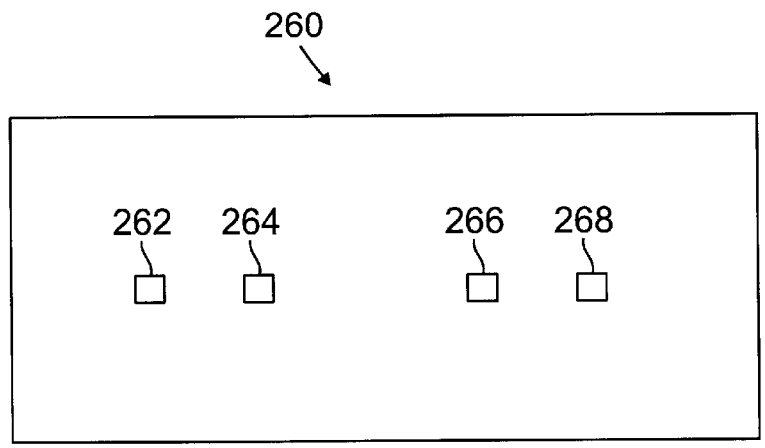

FIG. 1f shows contact placements 163, 164, 165, 166 formed by patterning an oxide layer 162 and a gate insulator 133, 135. FIG. 2f shows a mask 260 including square patterns 262, 264, 266, 268 which may be used to form the contact placements 163, 164, 165, 166, respectively. The contact placements 163, 164, 165, 166 will allow metal applied in the next step to contact the diffusion regions 142, 144, 152, 154 and the polysilicon gate 134, 136 in appropriate locations.

Figure 1G:
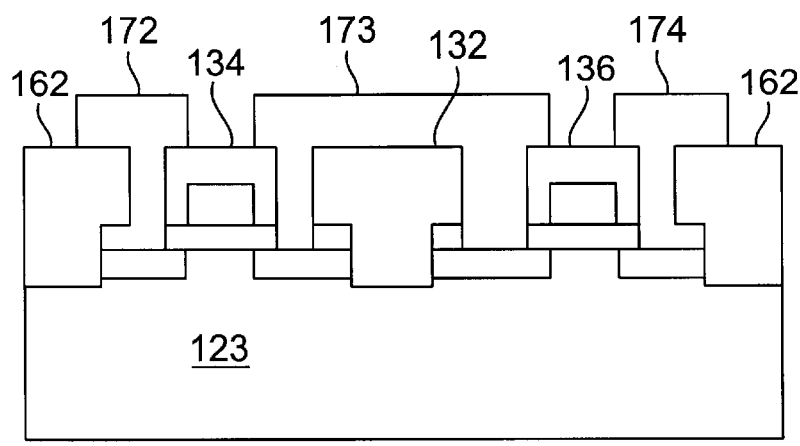
Figure 2G:
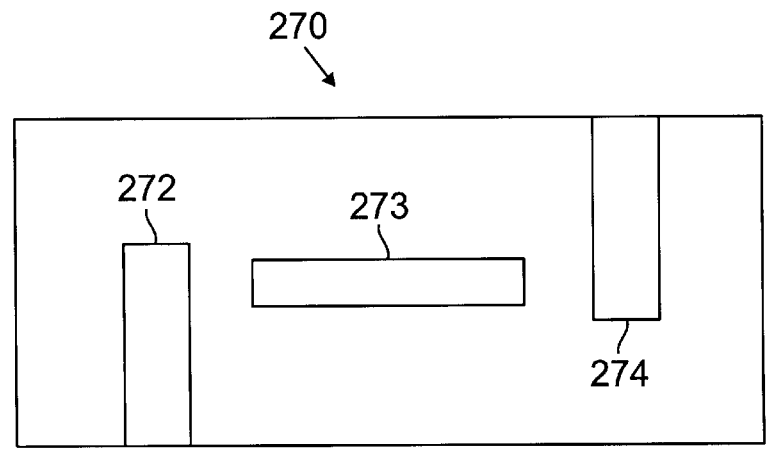

FIG. 1g shows portions 172, 173, 174 of a metal layer which has been deposited and patterned using a mask 270 shown in FIG. 2g, for providing interconnections between unit cells.

As a final step (not shown), the unit cell is passivated and openings for the wiring to the pads of chip package are formed. As is known in the art, passivation protects the silicon surface against the ingress of contaminants that can deleteriously modify the circuit behavior.

Prior to full production of the integrated circuit with a set of masks, prototype integrated circuits are tested to determine whether the chips meet the performance specifications of the customer, within acceptable tolerances. The integrated circuits are typically tested in a real or simulated environment, as discussed above. If a parameter of the integrated circuit, such as the power dissipation of the circuit, does not meet the performance specification, the integrated circuit will need to be redesigned. Because of the complex, multilevel and interconnected structure of the transistors of the integrated circuit, redesign of the transistors has traditionally required the redesign of most or all of the masks used in the fabrication process.

The process of the present invention enables the parameters of the transistors to be tuned or adjusted after prototype verification of the gate arrays by modifying the size of one of the layers of the transistors so that most of the verified masks need not be redesigned, decreasing the length and cost of the fabrication process.

Power dissipation of a transistor is defined as: $P=vi+Cv^2f$, wherein "v" is applied voltage, "i" is the current flow between the source and the drain, "C" is the capacitance between the gate and the active area and "$f$" is the frequency of the input voltage. Decreasing the gate width decreases the capacitance, as well as the current flow. In accordance with the present invention, if prototype testing indicates that power dissipation needs to be decreased, the effective gate width of a transistor is reduced by reducing the size of the active area beneath the gates. Reducing the size of the active area beneath the gate electrode causes a reduction in the effective area of the gate insulator sandwiched between the gate electrode and the active area, due to the increased area of field oxide. The capacitance is thereby reduced. The active area can be reduced by changing only the active area mask. None of the other masks need to be changed, as described further, below.

Figure 3A:
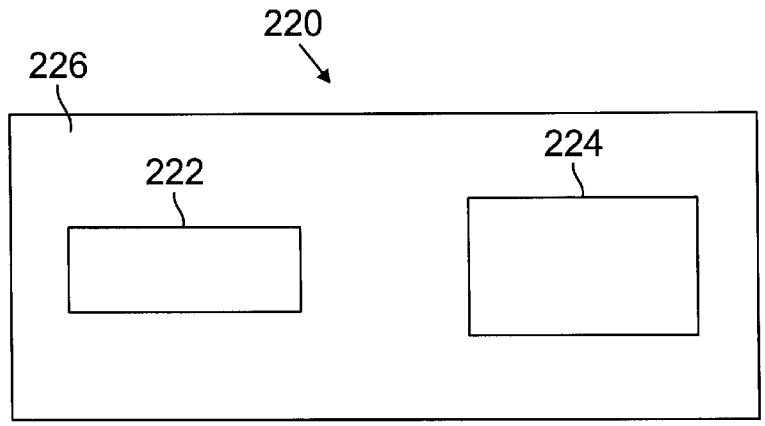
FIG. 3*a* is an enlarged view of the active area mask of FIG. 2*c*.

FIG. 3a is an enlarged view of the exemplary active area mask 220 of FIG. 2c. The mask 220 has a plain rectangular pattern 222, 224 corresponding to the shape of the active areas 123, 125 in FIG. 1b. The p-channel transistor side is usually larger than n-channel transistor to compensate for carrier mobility.

Figure 3B:
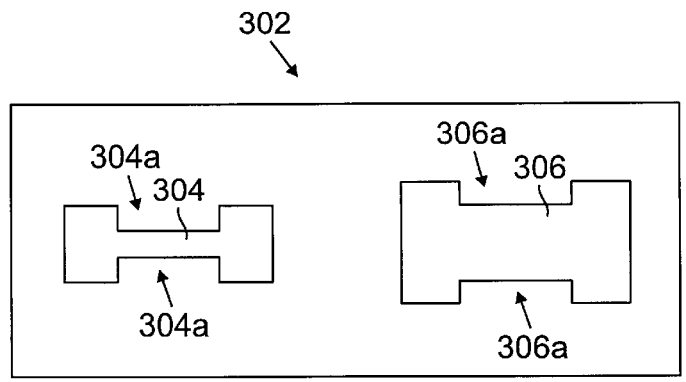
FIG. 3*b* is an example of a new mask for redefining the size of the active areas.
Figure 3C:
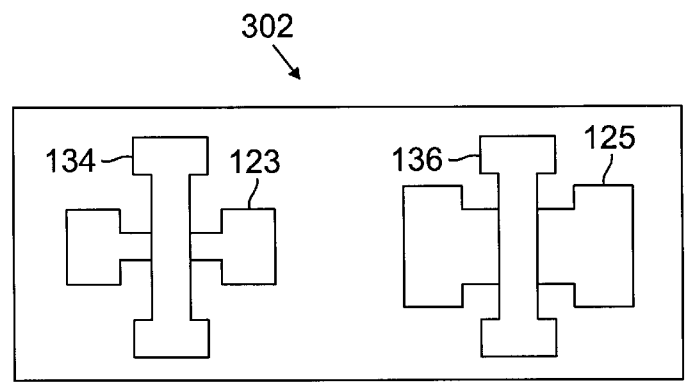
FIG. 3*c* a plan view of an active area fabricated by the new mask of FIG. 3*b*, and polysilicon gates.

FIG. 3b shows an example of a new mask 302, redefining the area of the active areas 123, 125 beneath the gates according to the present invention to reduce power dissipation. The sizes of the patterns 304, 306 of the new mask are reduced as compared to the patterns 222, 224 in FIG. 3a by the areas of the indented regions 304a, 306a, respectively. Silicon oxide and nitride layers, or other such layers, formed through the use of the active mask 302 would have the shapes of the patterns 304, 306. Field oxide would therefore grow into the substrate within the indented regions, decreasing the size of the active areas which will be formed in subsequent steps. When redesigning the active area, the active area beneath and around the contact placements should be retained so that the mask defining the contact placements, and related masks such as the masks used for applying the metal interconnection layers, need not be changed, as discussed further below. FIG. 3c is an example of active areas 123, 125 defined by the new mask of FIG. 3b, with gates 134, 136 positioned over the active areas.

The new mask 302 replaces the original active area mask 220 in the set of masks used to fabricate the integrated circuit. Only one new mask needs to be designed to define the new active area in accordance with the process of the invention. The patterns 304, 306 are merely illustrative. Any pattern may be used.

The area of the pattern defining the active area can be re-calculated through the use of circuit simulation software, such as HSPICE®. Knowing the desired power dissipation needed, HSPICE® can be used in an iterative way by fine-tuning the effective gate widths and re-running the simulations for power. After each simulation, a designer can reconfigure the size of the effective gate width by reducing the size and shape of the active area until the desired power dissipation is met. HSPICE® is commercially available from AVANT!, Sunnyvale, Calif.

If the power dissipation is too low, the effective channel width can be increased by enlarging the area of the pattern of the mask defining the active area, thereby enlarging the resulting active areas. The current and resulting power dissipation would then be increased.

Figure 4:
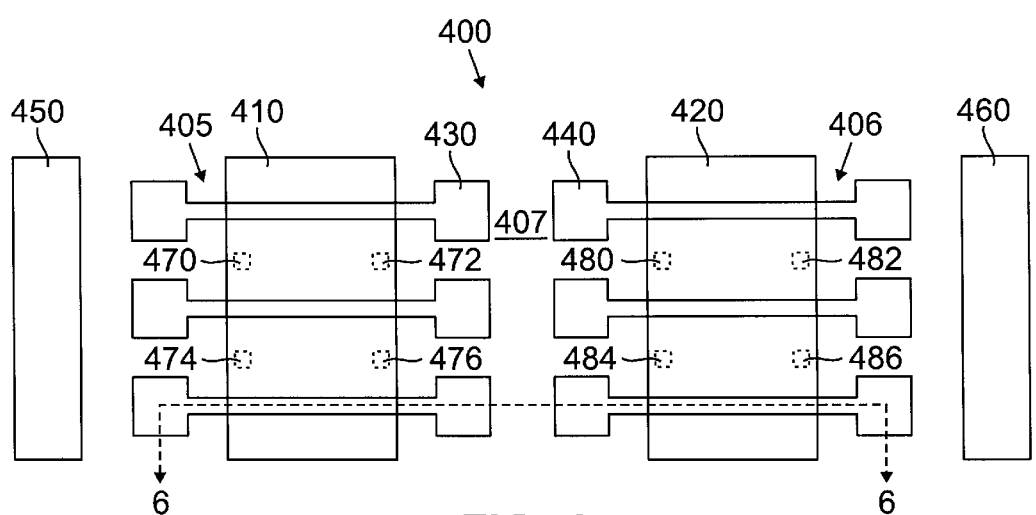
FIG. 4 is a plan view of a portion of a partially completed prototype gate array, showing diffusion areas or active areas and the gate electrodes.

In another example of the process of the present invention, FIG. 4 is a plan view of a portion of a partially completed prototype gate array 400, showing diffusion areas or active areas 410, 420 and the gate electrodes 430, 440. The active area 410 and the gate electrodes 430 form an n-channel transistor area. The active area 420 and the gate electrodes 440 form an a p-channel transistor area. An insulation layer, not shown in this view, covers each of the active areas 410, 420. A ground source $V_{ss}$ 450 is doped with p$^+$ and a power source $V_{dd}$ 460 is doped with n$^+$. Field oxide 405, 406, 407 isolates the transistors. Contact placements 470 and 480 are shown in phantom. The gate array 400 may be personalized with metal and oxide layers and then tested for verification, as described above. Adjacent n-channel and p-hannel transistors form a unit cell, as discussed above.

Figure 5:
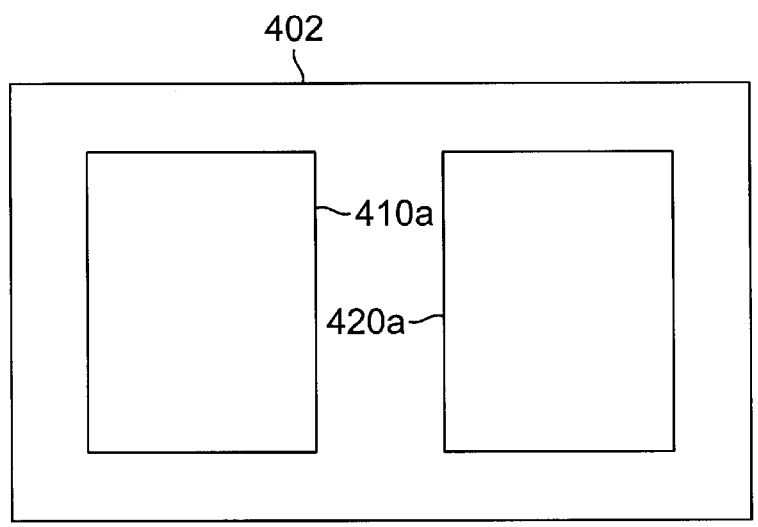
FIG. 5 is a plan view of a prior art active area mask, including patterns for forming the active areas.

FIG. 5 is a plan view of an active area mask 402 including patterns 410a and 420a for forming the active areas 410 and 420, respectively. The insulating layers are formed through the use of the active area mask 402, as well. The integrated circuits fabricated with the set of masks including the new active area mask are then tested as were the prototype integrated circuits. If performance specifications for power dissipation are met, full production may commence. If not, the active area may be redesigned and a new active area mask provided, until the performance specifications are met.

Figure 6:
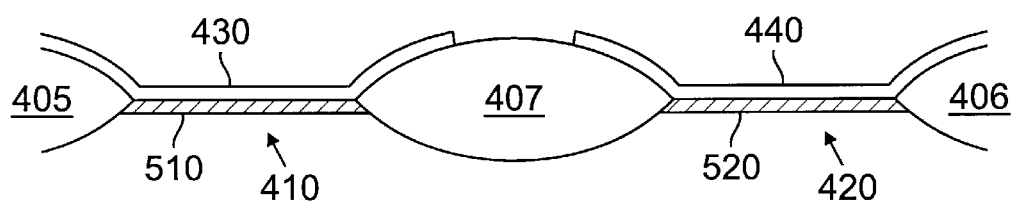
FIG. 6 is a cross-section of one unit cell of the gate array along line 6—6 of FIG. 4.

FIG. 6 is a cross-section of one unit cell of the gate array 400 along line 6—6 of FIG. 4. Gate insulators 510 and 520 are shown within the active areas 410, 420, respectively. The gate electrodes 430, 440 are positioned above the gate insulators 510, 520. The outer portions of the gate electrodes 430, 440 cover the field oxide 405, 406.

If prototype testing indicates that the power dissipation of the transistors needs to be decreased, a new mask for redefining the active areas is generated in accordance with the present invention, as described above, to reduce the size of the active areas 410, 420.

Figure 7:
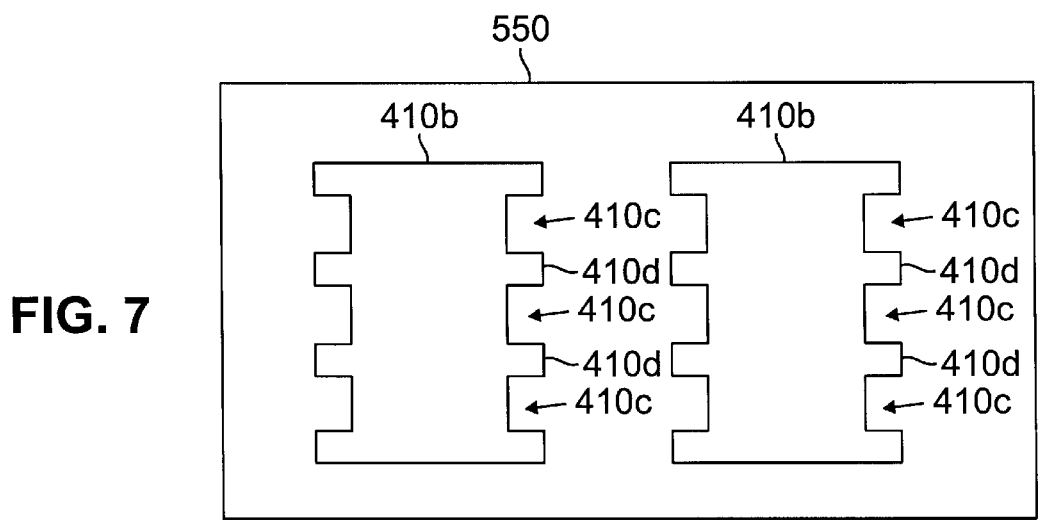
FIG. 7 is a plan view of a new active area mask including patterns for defining active areas of reduced size, in accordance with the present invention.

FIG. 7 is a plan view of a new active area mask 550 including patterns 410b and 420b for defining active areas of reduced size. The patterns 410b, 420b include indented regions 410c, 420c, respectively, which reduce the areas of the patterns for defining the active areas, relative to the patterns 410a, 420a of the original active area mask 402. The indented regions 410C, 420C are preferably between portions 410d, 420d of the mask patterns 410b, 420b, respectively, which define portions of the active area at the original positions of the contacts 470 and 480, respectively. A tolerance for the active area around the contact areas, as dictated by the design rules of the foundry where the IC is to be fabricated, is also included. In this way, the positions of the original contact placements and the metal to be connected to the active layers through the contact placements need not be changed. It is not therefore, necessary to change the masks for defining the contact placements or the metallization layers. Positioning the contact placements midway between adjacent polysilicon gates facilitates redesign of the active areas without changing the position of the contact placements. The mask 550 replaces the mask 402 in the set of masks used to fabricate the prototype integrated circuit.

Figure 8:
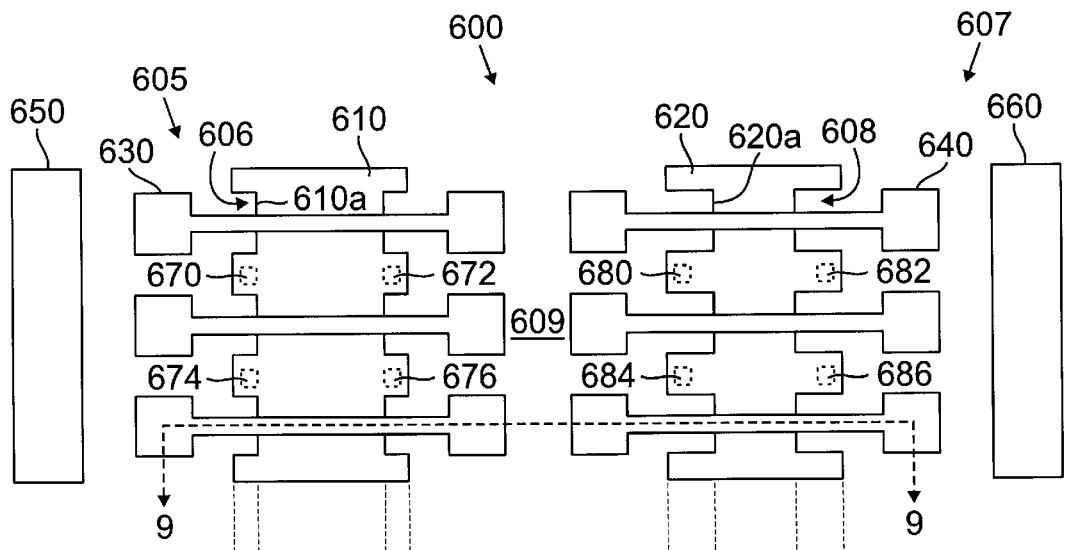
FIG. 8 is a plan view of a partially completed prototype gate array fabricated with a set of masks including the new active area mask of FIG. 7, in accordance with the present invention.

FIG. 8 is a plan view of a partially completed prototype gate array 600 fabricated with a set of masks including the new active area mask 550 in accordance with the method of the present invention, with active areas 610, 620 having indented regions 610a, 620a, reducing the size of the active areas 410, 420 of the prototype gate array 400 in FIG. 4, to decrease the power dissipation. In FIG. 8, the field oxide 605, 607, 609 includes regions 606, 608 which extend into the indented regions 610a and 620a of the active areas 610, 620, respectively. The insulating layers for gate insulators, not shown in this view, are also defined by the new active area mask of FIG. 7. The field oxide regions 606, 608 are formed in portions of the substrate which had been part of the active areas in the prototype gate array 400 of FIGS. 5 and 6. The gate width of the gate array 600 is thereby reduced. As mentioned above, the indented regions 610a, 620a are preferably provided between the contact placements 670, 680, so that contact placements 670, 680 are in the same positions as the contact placements 470, 480 in FIG. 4. The masks for the defining the contact placements and related masks, such as the masks providing the metal interconnection layers, need not be changed.

Figure 9:
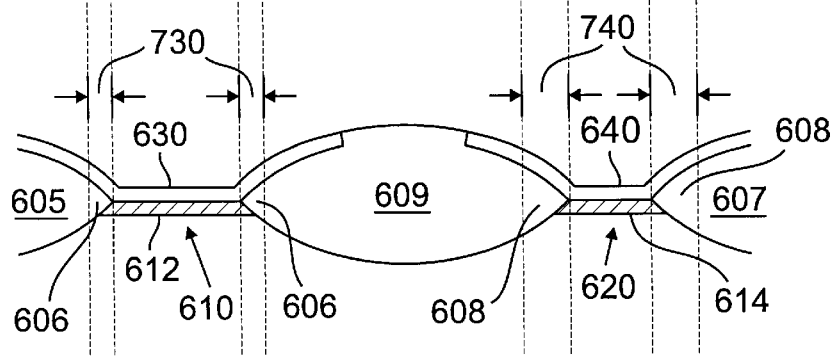
FIG. 9 shows a corresponding cross sectional view of a unit cell of the gate array along line 9—9 in FIG. 8.

FIG. 9 shows a corresponding cross sectional view of a unit cell of the gate array 600 along line 9—9 in FIG. 8, showing the field oxide regions 605 and 607 including the portions 606, 608, extending into the indented regions of the active areas 610, 620, respectively. The field oxide regions 605, 607 are larger than the corresponding field oxide regions 405, 406 in the prototype gate array of FIGS. 4 and 5. The areas of the substrate occupied by the field oxide regions 606, 608 had been part of the active areas in the prototype gate array 400 of FIGS. 4 and 6.

The gate arrays fabricated with the new mask are tested, as were the original prototype gate arrays. If the performance specifications are met within acceptable tolerances, full production will be initiated with the set of masks including the new mask for the active area. If the performance specifications are not met, the active areas may be further modified through the design and use of a new active area mask, until testing demonstrates that the performance specifications are met.

The sizes of the active areas may be extended to increase power dissipation of the gate array 600, as well, by increasing the size of the patterns 410b, 420b in the mask 420 of FIG. 5.

Other characteristics of the transistors of the integrated circuit, such as the speed of the integrated circuit or the capacitance of the gate may also be varied by varying the size of the active areas in accordance with the method of the present invention, as well.

It is possible that despite prototype testing, it is not discovered that performance specifications are not met until after full production of the integrated circuit. The present invention could then be used to adjust the power dissipation, or other characteristics, by redesign of the active area mask, as well.

The present invention may also be used after an IC designed for fabrication at a foundry using a particular set of design rules is redesigned for production at a different foundry using a different set of design rules. After redesign of the IC, new production masks must also be created. Such redesign of the IC may be extensive. After transformation of the design, power dissipation, and other such parameters, may not meet performance specifications within acceptable tolerances, necessitating further redesign of the IC and the production masks. Such parameters may be adjusted in accordance with the method of the present invention, minimizing the further redesign of the circuit and production masks.

Table I–Table IV, below, show the results of HSPICE® simulations measuring normalized dynamic power dissipation for three logic circuits, INV, NAND, NOR, for different gate widths.

TABLE I

Normalized Dynamic Power Dissipation ($\mu$W/MHZ/load)
($12\mu$ p-transistor/$8\mu$ n-transistor)

|  | 3.3 V @ 25 C 4 load | 3.3 V @ 25 C 16 load | 3.6 V@ –55 C 4 load | 3.6 V @ –55 C 16 load | 5.0 V @ 25 C 4 load | 5.0 V @ 25 C 16 load | 5.5 V @ –55 C 4 load | 5.5 V @ –55 C 16 load |
| --- | --- | --- | --- | --- | --- | --- | --- | --- |
| Inv | 0.53 | 0.46 | 0.59 | 0.51 | 1.35 | 1.12 | 1.43 | 1.22 |
| Nand | 0.59 | 0.48 | 0.66 | 0.52 | 1.44 | 1.15 | 1.70 | 1.28 |
| Nor | 0.56 | 0.47 | 0.62 | 0.52 | 1.39 | 1.13 | 1.62 | 1.26 |

TABLE II

Normalized Dynamic Power Dissipation
($\mu$W/MHZ/load) After Power Tuning ($6\mu$ p-transistor/$4\mu$ n-transistor)

|  | 3.3 V @ 25 C 4 load | 3.3 V @ 25 C 16 load | 3.6 V@ –55 C 4 load | 3.6 V @ –55 C 16 load | 5.0 V @ 25 C 4 load | 5.0 V @ 25 C 16 load | 5.5 V @ –55 C 4 load | 5.5 V @ –55 C 16 load |
| --- | --- | --- | --- | --- | --- | --- | --- | --- |
| Inv | 0.29 | 0.24 | 0.33 | 0.27 | 0.72 | 0.58 | 0.85 | 0.55 |
| Nand | 0.33 | 0.25 | 0.36 | 0.28 | 0.78 | 0.60 | 0.99 | 0.68 |
| Nor | 0.31 | 0.25 | 0.35 | 0.28 | 0.72 | 0.59 | 0.85 | 0.67 |

TABLE III

Normalized Dynamic Power Dissipation
($\mu$W/MHZ/load) After Power Tuning ($4\mu$ p-transistor/$2.5\mu$ n-transistor)

|  | 3.3 V @ 25 C 4 load | 3.3 V @ 25 C 16 load | 3.6 V@ –55 C 4 load | 3.6 V @ –55 C 16 load | 5.0 V @ 25 C 4 load | 5.0 V @ 25 C 16 load | 5.5 V @ –55 C 4 load | 5.5 V @ –55 C 16 load |
| --- | --- | --- | --- | --- | --- | --- | --- | --- |
| Inv | 0.22 | 0.17 | 0.23 | 0.19 | 0.51 | 0.41 | 0.59 | 0.47 |
| Nand | 0.24 | 0.18 | 0.28 | 0.20 | 0.57 | 0.42 | 0.65 | 0.49 |
| Nor | 0.23 | 0.18 | 0.26 | 0.20 | 0.55 | 0.42 | 0.62 | 0.48 |

TABLE IV

Gate Widths(um), Propagation Delays(ps),
and Normalized Power($\mu$W/MHZ/load)

|  | gate n | width p | 3.3 V prop HL | @ 25° C. delay LH | power | 5.0 V prop HL | @ 25° C. delay LH | power |
| --- | --- | --- | --- | --- | --- | --- | --- | --- |
| inv | 8 | 12 | 254 | 363 | 0.53 | 205 | 266 | 1.35 |
|  | 4 | 6 | 308 | 386 | 0.29 | 233 | 259 | .72 |
|  | 2.5 | 4 | 387 | 401 | 0.22 | 303 | 273 | .51 |

TABLE IV-continued

Gate Widths(um), Propagation Delays(ps),
and Normalized Power(µW/MHZ/load)

|  | gate n | width p | 3.3 V prop HL | @ 25° C. delay LH | power | 5.0 V prop HL | @ 25° C. delay LH | power |
|---|---|---|---|---|---|---|---|---|
| nand | 8 | 12 | 430 | 239 | 0.59 | 339 | 165 | 1.44 |
|  | 4 | 6 | 503 | 238 | 0.33 | 385 | 159 | .78 |
|  | 2.5 | 4 | 675 | 251 | 0.24 | 511 | 170 | .57 |
| nor | 8 | 12 | 264 | 593 | 0.56 | 210 | 418 | 1.39 |
|  | 4 | 6 | 319 | 647 | 0.31 | 242 | 424 | .75 |
|  | 2.5 | 4 | 412 | 712 | 0.23 | 313 | 455 | .55 |

Table I summarizes the simulated normalized dynamic power dissipation of logic circuits under supply voltages of 3.3 V, 3.6 V 5.0 V and 5.5 V. At each voltage, power dissipation at a load of 4 and 16 was determined. The gate widths were 12 microns for the p-channel transistors and 8 microns for the n-channel transistors. At the supply voltages of 3.3 V and 5.0 V, the temperature was 25° C. At the supply voltages of 3.6 V and 5.5, the temperature was −55° C. The power is expressed in units of µW/MHz/load. These results are comparable to the power dissipation in INV, NAND and NOR circuits in a prototype integrated circuit.

Table II shows the simulated normalized dynamic power dissipation for the same logic circuits as in Table I, under the same conditions, with reduced gate widths in accordance with the process of the present invention. The gate widths of the p-channel and n-channel transistors were 6 microns and 4 microns, respectively. At 3.3 V, 4 gate load at 25° C., normalized power dissipation of the INV circuit was reduced from 0.53 µW to 0.29 µW, for example. Similar decreases in normalized power dissipation are shown at other conditions and for the other logic circuits, as well.

Table III shows the simulated normalized dynamic power dissipation for the same logic circuits as in Table I, under the same conditions, wherein the widths of the p-channel and the n-channel transistors were reduced to 4 microns and 2.5 microns, respectively. Normalized power dissipation of the INV circuit was reduced to 0.22 µW, for example. It is noted that the reduction in gate widths from 6 and 4 to 4 and 2.5, respectively, did not cause a proportional reduction in power dissipation.

Table IV shows the relationship between the propagation delay and the power dissipation of the circuits. The gate widths of the n-channel in the simulation was 8, 4 and 2.5 microns, while the gate widths of the p-channel in the simulation was 12, 6 and 4 microns, respectively. The data in Table IV indicates that the propagation delay increases with decreased power dissipation. Since the delay-power product remains constant, a 50% reduction in power dissipation is accompanied by a 50% increase in propagation delay. In other words, there is a trade-off between power dissipation and propagation delay of the integrated circuit.

The method of the present invention has been described with respect to an n-well CMOS processing technology. However, it is apparent to one of ordinary skill in the art that the invention can also be readily applied to other types of MOSFETs, such as p-well CMOS, and simple n- or p-type MOSFET.

While a preferred process has been described, it is understood that changes may be introduced to the process described without departing from the scope of the present invention, which is defined by the claims, below.

What is claimed is:

1. A method of manufacturing an integrated circuit to meet performance specifications for power dissipation, comprising:
    a) fabricating at least one first prototype integrated circuit with a set of masks including a first mask for defining at least one active area of the integrated circuit;
    b) testing the at least one prototype integrated circuit to determine whether performance specifications are met;
    c) determining the size of the at least one active area required to meet the performance specifications based on the test results, if the performance specifications are not met;
    d) creating a second mask for defining the at least one active area having the determined size;
    e) replacing the first mask by the second mask to create a second set of masks;
    f) fabricating at least one second prototype integrated circuit with the second set of masks;
    g) testing the at least one second prototype integrated circuit to determine whether performance specifications are met; and
    h) proceeding with manufacture of the integrated circuit with the second set of masks if the performance specifications are met.

2. The method of claim 1, wherein, if the performance specification are not met, the method further comprises repeating steps c) through g) to create one or more subsequent masks for defining the at least one active area for fabrication of at least one subsequent prototype integrated circuit, until the performance specifications are met.

3. The method of claim 1, wherein step g) comprises testing the at least one second prototype integrated circuit to determine whether the power dissipation performance specifications are met.

4. The method of claim 1, comprising growing field oxide in at least one region of the substrate of the second prototype integrated circuit which was part of the at least one active area in the first integrated circuit.

5. The method of claim 1, wherein step c) comprises determining the gate width required for providing the power dissipation of the performance specifications and determining the size of the active area required to provide said gate width.

6. The method of claim 5, comprising reducing the size of the active area to reduce the gate width and decrease power dissipation.

7. The method of claim 1, comprising creating a second mask for defining the at least one active area, the second mask having a portion for defining a portion of the active area at the original positions of the contacts to the active area.

8. The method of claim 7, comprising fabricating at least one first prototype integrated circuit with a set of masks including a mask for defining at least one contact to the active area midway between adjacent gates.

9. A method of reconfiguring parameters of transistors in a metal oxide semiconductor integrated circuit to meet performance specifications after testing of a prototype of the integrated circuit fabricated by a set of masks, comprising:

determining a size of at least one active area of the integrated circuit required to meet the performance specifications, based on the testing of the prototype integrated circuit, if the testing indicates that a parameter of the integrated circuit does not meet the performance specifications; and creating a new mask for defining the at least one active area based on the determining step.

10. The method of claim 9, wherein the set of masks includes an active area mask for defining the at least one active area, the method further comprising replacing the active area mask of the set of masks by the new mask.

11. The method of claim 10, further comprising fabricating at least one second prototype integrated circuit with the set of masks including the new mask and testing the at least one second prototype integrated circuit.

12. The method of claim 10, comprising determining the gate width for providing the power dissipation of the performance specifications and determining the size of the at least one active area to define the gate width.

13. The method of claim 12, comprising reducing the size of the active area to reduce the gate width and decrease power dissipation.

14. The method of claim 10, comprising creating a new mask for defining the at least one active area, the new mask having a portion for defining a portion of the active area at the original position of the contacts to the active area at the position of contacts to the active area.

15. The method of claim 14, comprising fabricating at last one first prototype integrated circuit with a set of masks including a mask for defining at least one contact to the active area midway between adjacent gates.

16. A method of adjusting parameters of transistors in a metal oxide semiconductor logic circuit after prototype testing, comprising:

fabricating at least one prototype logic circuit with a set of custom masks; and adjusting the parameters of the logic circuit by changing the configuration of only one layer of the transistor of the logic circuit.

17. The method of claim 16, comprising adjusting the power dissipation of the logic circuit.

18. The method of claim 17, comprising adjusting the power dissipation by changing the size of the active area.

19. The method of claim 18, wherein the creating step further comprises changing the shape of the changed layer.

20. The method of claim 16, further comprising testing the prototype logic circuit to verify the operation of the prototype logic circuit.

21. The method of claim 16, wherein the adjusting step comprises creating a new mask for defining the configuration of the changed layer.

22. The method of claim 21, further comprising replacing the original mask for defining the configuration of the changed layer by the new mask in the set of custom masks and fabricating another logic circuit with the set of masks including the new mask.

23. The method of claim 16, comprising creating a second mask for defining the at least one active area, the new mask having a portion for defining a portion of the active area at the original position of the contacts to the active area.

24. The method of claim 23, comprising fabricating at least one first prototype integrated circuit with a set of masks including a mask for defining at least one contact to the active area midway between adjacent gates.

25. A method of reconfiguring parameters of transistors in a metal oxide semiconductor integrated circuit after prototype testing to decrease power dissipation to meet performance specifications, the integrated circuit having been made in a fabrication process using a set of masks including a first mask for defining the active areas of the integrated circuit, comprising:

determining the configuration of the active areas of the integrated circuit to decrease gate widths to decrease the power dissipation, based on the test results; and creating a new mask for defining the active areas, the new mask having a portion for defining a portion of the active area at the original position of the contacts to the active area.

26. The method of claim 25, further comprising:

replacing the first mask by the new mask in the set of masks, the other masks remaining the same; and fabricating a second prototype integrated circuit with the set of masks including the new mask.

27. The method of claim 25, comprising fabricating at least one first prototype integrated circuit with a set of masks including a mask for defining at least one contact to the active area midway between adjacent gates.

* * * * *